(12) United States Patent
Sung et al.

(10) Patent No.: US 6,194,269 B1
(45) Date of Patent: *Feb. 27, 2001

(54) METHOD TO IMPROVE CELL PERFORMANCE IN SPLIT GATE FLASH EEPROM

(76) Inventors: Kuo-Tung Sung, 1F, #34, Lane 376, Section 1, Kuang-Fu Road, Hsinchu; Huoy-Jong Wu, No. 39, Lane 107, Sung-Chu Road, Taichung, both of (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/036,542

(22) Filed: Mar. 6, 1998

(30) Foreign Application Priority Data

Feb. 25, 1998 (TW) ................................. 87102745

(51) Int. Cl.⁷ ............................................. H01L 21/8247
(52) U.S. Cl. ........................... 438/258; 438/266; 438/291
(58) Field of Search .................................. 438/266, 289, 438/291, 257–267

(56) References Cited

U.S. PATENT DOCUMENTS

| Re. 35,094 | 11/1995 | Wu et al. ................................ 437/43 |
| 4,236,167 | * 11/1980 | Woods . |
| 4,814,286 | * 3/1989 | Tam . |
| 5,066,992 | 11/1991 | Wu et al. ............................. 357/23.5 |
| 5,202,850 | 4/1993 | Jenq ..................................... 365/185 |
| 5,278,087 | 1/1994 | Jenq ...................................... 437/43 |
| 5,440,159 | 8/1995 | Larsen et al. ........................ 257/318 |
| 5,493,534 | 2/1996 | Mok ..................................... 365/226 |
| 5,554,553 | * 9/1996 | Harari . |
| 5,587,951 | 12/1996 | Jazayeri et al. ..................... 365/203 |
| 5,606,532 | 2/1997 | Lambrache et al. .............. 365/238.5 |
| 5,680,346 | 10/1997 | Pathak et al. ..................... 365/185.1 |
| 5,736,443 | * 4/1998 | Park et al. ........................... 438/257 |
| 5,956,588 | * 9/1999 | Choi et al. ........................... 438/286 |
| 5,972,753 | * 10/1999 | Lin et al. ............................ 438/265 |

OTHER PUBLICATIONS

Stanley Wolf, Ph.D., Silicon Processing for the VLSI Era, vol. II: *Process Integration*, (1990), Lattice Press, pp. 634–635.

* cited by examiner

*Primary Examiner*—Richard Booth
(74) *Attorney, Agent, or Firm*—Townsend and Townsend and Crew LLP

(57) ABSTRACT

Methods to improve cell performance in ROM semiconductor integrated circuit devices, in particular split gate cell flash EEPROM devices, without the need for increasing cell size or for decreasing tunnel oxide thickness. The threshold voltage under a first gate electrode (140) is adjusted using a first impurity introducing step, such as an ion implant, and the threshold voltage under a split gate electrode (170) is also adjusted using a second impurity introducing step, such as an ion implant. Depending on the type of cell used, the first gate electrode or the split gate electrode may be used as a floating gate electrode and the threshold voltage under the floating gate electrode may be adjusted separately from the other gate electrode to provide improved cell erase performance, with or without increasing the cell size or decreasing the tunnel oxide thickness.

19 Claims, 6 Drawing Sheets

METHOD TO IMPROVE CELL PERFORMANCE IN SPLIT GATE FLASH EEPROM

BACKGROUND OF THE INVENTION

The present invention relates to semiconductor integrated circuits and their manufacture. The invention is illustrated in an example with regard to the manufacture of a read only memory ("ROM") cell, and more particularly to the manufacture of a flash electrically-erasable programmable read only memory ("Flash EEPROM") cell, but it will be recognized that the invention has a wider range of applicability. Merely by way of example, the invention may be applied in the manufacture of other semiconductor devices such as random access memory (RAM), mask ROMs, microcontrollers, microprocessors, application specific integrated circuits, among others.

Read only memories (ROMs) and various methods of their manufacture are known in the art. In the fabrication of a ROM, particularly an EEPROM, it is necessary to fabricate a storage cell that maintains data after the applied power is turned off, that is, a storage cell having almost permanent data characteristics. The storage cells are generally mass data storage files where each cell corresponds to the presence or absence of a stored charge on a "floating" gate of a storage cell transistor. Specifically, the storage cell includes at least two conducting layers—one conducting layer is the floating gate of the storage cell transistor, and another conducting layer is the control gate (or erase gate) for control of the cell operation—which may be, for example, polysilicon. In an exemplary typical split gate flash EEPROM device, the first gate is formed on a thin gate oxide on the substrate, and part of the split gate is formed on the thin gate oxide and the other part of the split gate is formed over the first gate. In such a device, these gates are isolated from each other by a thin dielectric layer known as an "interpoly oxide", which may be composed of oxide or oxide/nitride/oxide ("ONO"). In some typical EEPROMs, data is programmed into the cells by applying a high voltage to the control gate to inject hot electrons (or tunnel electrons in some devices) into the floating gate, and data is erased by electrons being drawn from the floating gate through a portion (often referred to as "tunnel oxide") of the gate oxide by the Fowler-Nordheim tunneling mechanism. The process of programming data is often called coding.

In some of these particular types of split gate flash EEPROMs, a thin gate oxide is formed on the substrate. Then, a first conducting layer is formed on the thin gate oxide, patterned to form first gate electrodes. An interpoly oxide is grown over the first gate electrodes. Then, a second conducting layer is formed over the interpoly oxide and patterned to form split gate electrodes, which partially overly the first gate electrodes.

Often, in such a device, a threshold voltage ("$V_t$") adjust ion implant is performed prior to forming the gate electrodes in order to set the threshold voltage for the transistor (e.g., NMOS) channel region under the gate electrodes used as the select/control gate and the floating gate. Because the select/control gate is used for operation of the NMOS transistor which requires a predetermined threshold voltage, the threshold voltage adjust ion implant step is performed simultaneously to adjust the threshold voltage under both the floating gate and the select/control gate. Typically in the split gate cell, this threshold voltage adjust ion implant is predetermined by the requirements for the transistor with the select/control gate, thereby leaving little room for adjustment of the threshold voltage under the floating gate. That is, the threshold voltage under the select gate cannot be too low; otherwise, there will be leakage problems. However, the threshold voltage under the floating gate does not have such a limitation. In fact, the lower the threshold voltage under the floating gate is, the higher the cell current that can be obtained. The cell current is desired to be as high as possible, as long as the cell can still be programmed. Although it is desirable that the cell current be as high as possible in order to improve cell erase performance, the threshold voltage under the select gate often limits the ability to adjust the threshold voltage under the floating gate. Conventional approaches to improving cell erase performance have been to improve the electron tunneling efficiency by decreasing the tunnel oxide thickness or by increasing the gate coupling ratio ("GCR"). However, these conventional approaches undesirably result in cell reliability problems or larger cell size. In particular, decreased tunnel oxide thickness results in cell reliability problems, especially over time with multiple erase cycles, and an increased GCR of the storage cell results in an increased size of the gates and overall increase in the cell size (and therefore die size, resulting in lower device yield per wafer). Techniques for improving cell performance are important, especially since design rules for devices are becoming increasingly smaller and the requirements for device speed and performance are increasing.

From the above it is seen that an improved method of fabricating semiconductor ROM devices with reliable and improved cell performance is desired.

SUMMARY OF THE INVENTION

The present invention provides a method and resulting structure for an integrated circuit device having improved cell performance. In particular, the present invention provides an improved ROM integrated circuit and method of manufacture therefor.

According to an embodiment, the present invention provides a method of forming a semiconductor device. The method includes the steps of providing a semiconductor substrate, forming a thin oxide layer on said semiconductor substrate, and introducing first impurities into a first region of said semiconductor substrate where a first gate electrode is to be formed and into a second region of the semiconductor substrate where a split gate electrode is to be formed. The first introducing step adjusts a first threshold voltage in the first region. The method also includes the steps of forming a first gate electrode on the thin oxide layer, and introducing second impurities into the second region of the semiconductor substrate where the split gate electrode is to be formed and not into the first region. The first gate electrode has a top surface and a side surface, and the second introducing step adjusts a second threshold voltage in the second region. The method further includes steps of forming a dielectric layer over the top surface and the side surface of the first gate electrode, and forming the split gate electrode on at least a portion of the dielectric layer formed over the first gate electrode and over the second region.

Benefits of the various embodiments include the ability to provide ROM semiconductor devices which achieve better cell performance without the need to decrease the tunnel oxide thickness or increase cell size for comparable performance. The present invention is especially useful for split gate cell flash EEPROM devices with increasingly small geometries.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENTS

Prior Art Fabrication Methods and EEPROM Structures

A simplified prior art EEPROM fabrication process and related structures may be briefly described in general as follows with reference to FIGS. 1A–1E, which are cross-sectional views of a typical prior art general method for forming a split gate flash EEPROM device.

FIG. 1 A shows a semiconductor substrate 10, such as silicon, with a gate oxide layer 20 formed thereon by a gate oxidation process. Typically gate oxide layer 20 has a thickness of about 70–250 ÅA, and is formed by a thermal oxidation process (e.g., subjecting the silicon substrate to an oxygen-containing environment in a thermal oxidation furnace) or by a chemical vapor deposition process. FIGS. 1A–1E illustrate cell regions, with each cell region corresponding to a region for storing a bit of information in an EEPROM semiconductor integrated circuit chip. Thousands and even millions of these microscopically small regions make up a core memory area (or active cell area) of the EEPROM chip. Typically in a completed EEPROM chip, the cell region will include multiple storage cell transistors (not shown), while the periphery region will include peripheral driver transistors, high-voltage power supply circuitry, interconnects and bonding pads, etc.

Figure 1A:
FIGS. 1A–1E are cross-sectional views of a simplified, general prior art fabrication method for split gate cell EEPROM semiconductor devices.
Figure 1B:
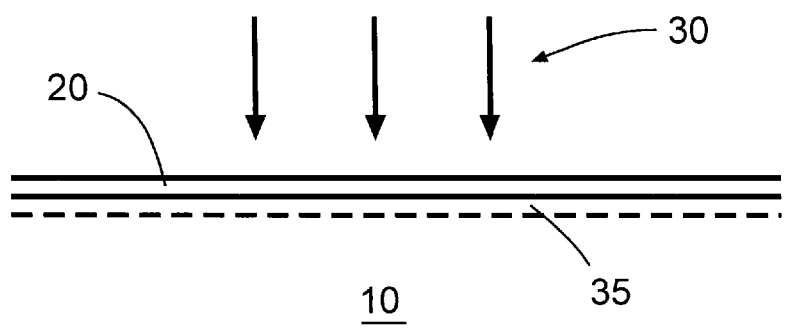

As seen in FIG. 1B, a threshold voltage adjust ion implant of impurities 30 is performed to adjust the threshold voltage in a channel region 35 where both the first gate electrode and the split gate electrode are to be formed in the cell region. As an example, for a PMOS type transistor channel region 35 formed in an N type substrate 10, impurities 30 are P type (e.g., B, $BF_2$, or the like) and are implanted at an energy level of about 20–50 keV and a dosage of about $10^{12}$ to about $10^{14}$ carriers/cm$^2$ in order to adjust the threshold voltage. As another example, for an NMOS type transistor channel region 35 formed in a P type substrate 10, impurities 30 are P type (e.g., B, $BF_2$, or the like) and are implanted at an energy level of about 20–50 keV and a dosage of about $10^{12}$ to about $10^{14}$ carriers/cm$^2$ in order to adjust the threshold voltage. It is noted that before or after the threshold voltage ion implant of impurities 30, isolation structures like isolation trenches or field oxide, etc. are also formed between cells.

Figure 1C:
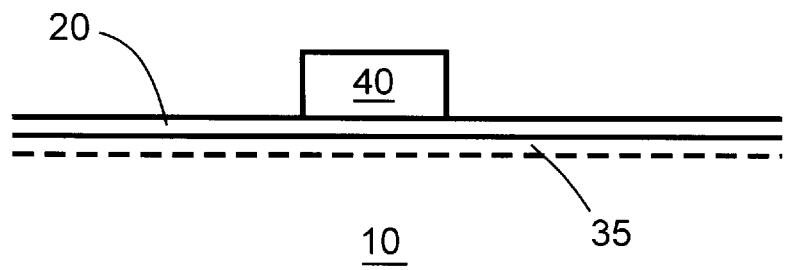

Once the threshold voltage adjust ion implant 30 is performed, a first conducting layer is formed on the thin gate oxide 20, masked and patterned then etched to form a first gate electrode 30 in the cell region, as shown in FIG. 1C. First gate electrode 30 may function as a select/control or erase gate electrode in the split gate cell, or as a floating gate electrode in the split gate cell, depending on the particular flash EEPROM device structure used. First conducting layer is typically formed of polysilicon, and gate electrode 30 may have a thickness of about 1000–2500 Å. Of course, to improve electrode conductivity, the first conducting layer may be in situ doped or doped subsequent to deposition.

Figure 1D:
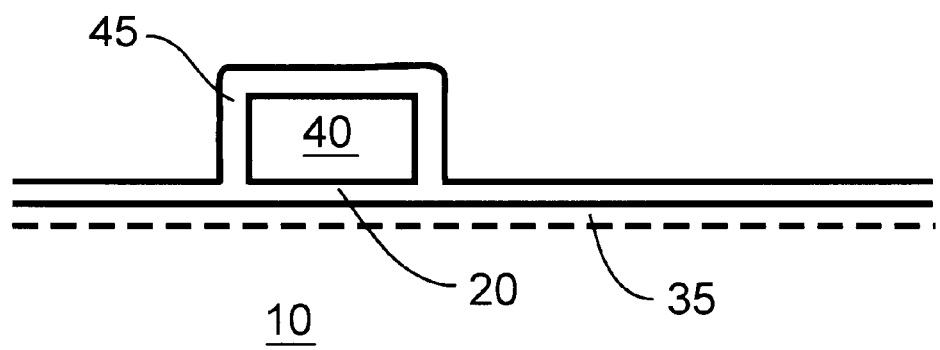

Then an oxidation process such as a thermal oxidation process, e.g., subjecting the silicon substrate 10 to an oxygen-containing environment in a thermal oxidation furnace, is performed to form a thick "interpoly" oxide 45 grown over first gate electrode 40, as seen in FIG. 1D.

Figure 1E:
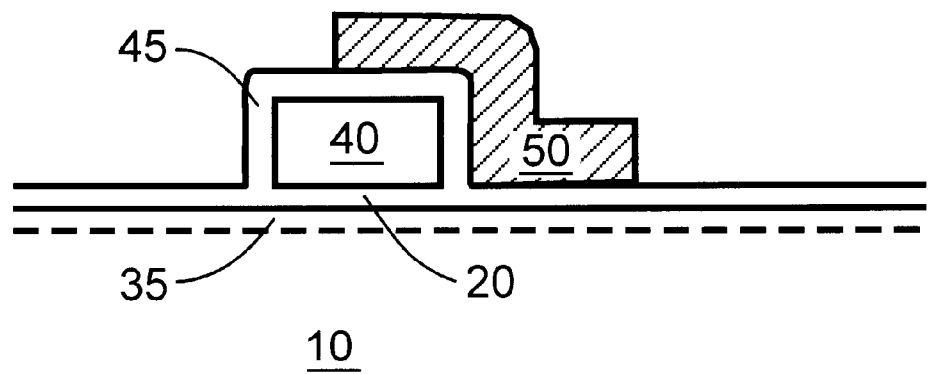

After this oxidation process, a second conducting layer is formed over a portion of gate electrode 40 covered by interpoly oxide 35 and over part of the gate oxide, and masked and patterned then etched to form a split gate electrode 50, as illustrated in FIG. 1E. The thickness of oxide 45 separating gate electrode 40 and gate electrode 50 may be about 300–500 ÅA, while the thickness of oxide 20 between the silicon substrate 10 and gate electrodes 40 and 50 may be about 100 Å. To improve electrode conductivity, the second conducting layer also may be in situ doped or doped subsequent to deposition. Split gate electrode 50 may function as a floating gate electrode in the split gate cell, or as a select/control or erase gate electrode in the split gate cell, depending on the particular flash EEPROM device structure used. Although not shown, source/drain regions and lightly-doped drain (LDD) regions for the transistors also are formed, e.g. by implanting or diffusion.

As mentioned above, prior art EEPROMs are often limited by the cell erase performance. In particular, in split gate flash EEPROMs, one threshold voltage adjust ion implant is performed prior to forming the gate electrodes in order to simultaneously set the threshold voltage for the transistor (e.g., NMOS) channel region under the gate electrode used as the select/control gate and set the threshold voltage for under the floating gate electrode. Typically in the split gate cell, this threshold voltage adjust ion implant is predetermined by the requirements for the transistor with the select/control gate, thereby leaving little room for adjustment of the threshold voltage under the floating gate. That is, the threshold voltage under the select gate cannot be too low; otherwise, there will be leakage problems. However, the threshold voltage under the floating gate does not have such a limitation. In fact, the lower the threshold voltage under the floating gate is, the higher the cell current that can be obtained. The cell current is desired to be as high as possible, as long as the cell can still be programmed. Although it is desirable that the cell current be as high as possible in order to improve cell erase performance, the threshold voltage under the select gate often limits the ability to adjust the threshold voltage under the floating gate. Conventional approaches to improving cell erase performance have been to improve the electron tunneling efficiency by decreasing the tunnel oxide thickness, or by increasing the gate coupling ratio ("GCR"). Such decreased tunnel oxide thickness results in cell reliability problems, especially over time with multiple erase cycles, and an increased GCR of the storage cell results in an increased cell size (and therefore die size, resulting in lower device yield per wafer).

Methods for Fabricating EEPROMs with Improved Cell Performance

The present invention provides improved methods for fabricating devices, such as split gate flash EEPROMs, for improved cell performance without reliability problems or the need for increased cell size. FIGS. 2A–2F are cross-sectional views illustrating a general improved method for forming a ROM device, e.g., a split gate flash EEPROM device, according to embodiments of the present invention. The embodiments are shown for illustrative purposes only, and therefore should not limit the scope of the invention, as recited by the claims.

Figure 2A:
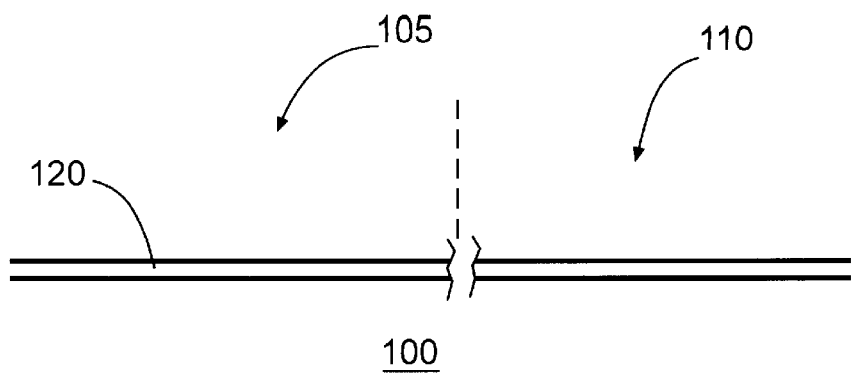
FIGS. 2A–2F are cross-sectional views of simplified fabrication methods for split gate cell EEPROM semiconductor devices with improved performance, in accordance with embodiments of the present invention.

FIG. 2A shows a semiconductor substrate 100, such as silicon with a gate oxide layer 120 formed thereon by a gate oxidation process. Typically gate oxide layer 20 has a thickness of about 70–250 Å, and is formed by a thermal oxidation process (e.g., subjecting the silicon substrate to an oxygen-containing environment in a thermal oxidation furnace) or by a chemical vapor deposition process. FIGS. 2A–2F illustrate a cell region 105 and a periphery region 110, with the cell region corresponding to a region for storing a bit of information in an EEPROM semiconductor integrated circuit chip. Thousands and even millions of these microscopically small cell regions make up a core memory area (or active cell area) of the EEPROM chip. Typically in a completed EEPROM chip, the cell region will include multiple storage cell transistors (not shown), while the periphery region will include peripheral driver transistors, high-voltage power supply circuitry, interconnects and bonding pads, etc. For FIGS. 2A–2F, different regions are shown separated by double wavy lines to indicate the existence of other structures (e.g., isolation structures like isolation trenches or field oxide, etc.) separating the regions.

Figure 2B:
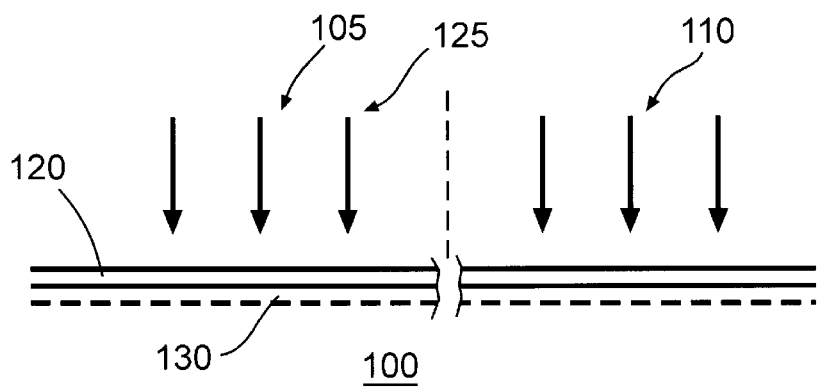

As seen in FIG. 2B, a first threshold voltage adjust, such as with an ion implant of impurities 125 or other impurity introducing process, is performed to adjust the threshold voltage in a channel region 130 where the first gate electrode is to be formed in the cell region 105 and where a gate electrode is to be formed in the periphery region 110. According to a specific embodiment, for a PMOS type transistor channel region 130 formed in an N type substrate 100 having about 8–12 Ω-cm resistivity, impurities 125 are P type (e.g., B, $BF_2$, or the like) and are implanted at an energy level of about 20–50 keV and a dosage of about $10^{12}$ to $10^{14}$ carriers/$cm^2$ in order to adjust the threshold voltage under the first gate electrode. According to another specific embodiment, for an NMOS type transistor channel region 130 formed in a P type substrate 100 having about 8–12 Ω-cm resistivity, impurities 125 are P type (e.g., B, $BF_2$, or the like) and are implanted at an energy level of about 20–50 keV and a dosage of about $10^{12}$ to $10^{14}$ carriers/$cm^2$ in order to adjust the threshold voltage under the first gate electrode.

Figure 2C:
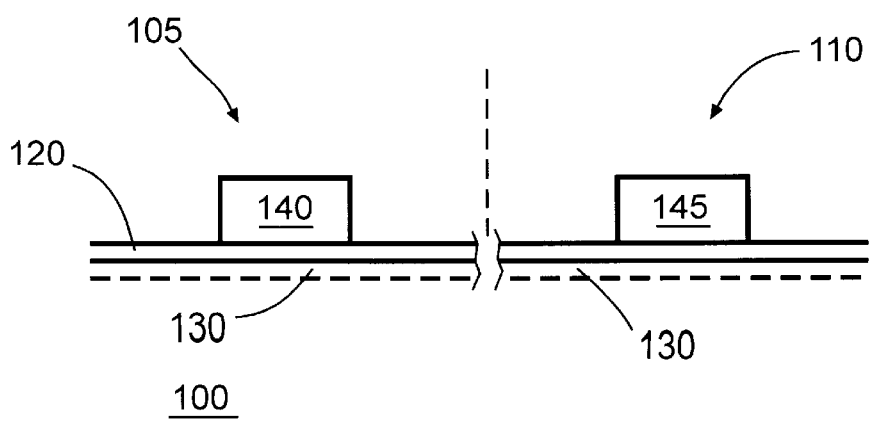

Once the first threshold voltage adjust ion implant 125 is performed, a first conducting layer is formed on the thin gate oxide 120, masked and patterned then etched to form a first gate electrode 140 in cell region 105 and to form a gate electrode 145 in periphery region 110, as shown in FIG. 2C. First gate electrode 140 may function as a select/control or erase gate electrode in the split gate cell, or as a floating gate electrode in the split gate cell, depending on the particular flash EEPROM device structure used. First conducting layer is typically formed of polysilicon, and gate electrodes 140 and 145 may have a thickness of about 1000–2500 Å. Of course, to improve electrode conductivity, the first conducting layer may be in situ doped or doped subsequent to deposition.

Figure 2D:
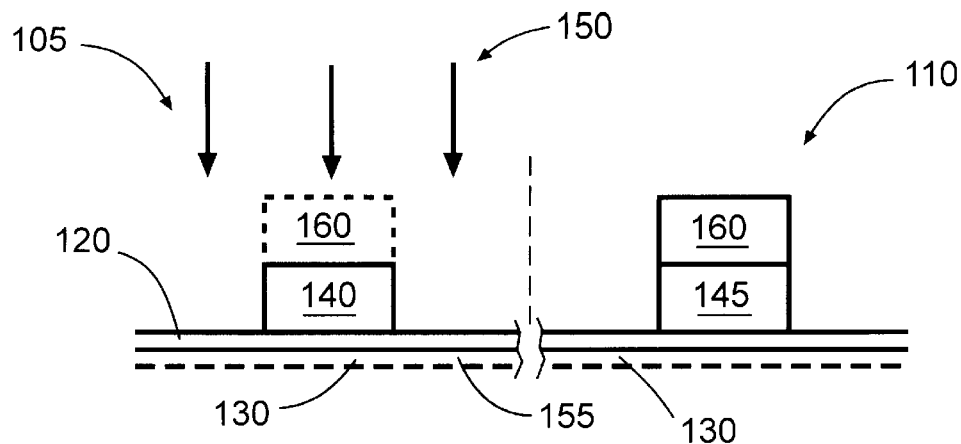

Then, as shown in FIG. 2D, a second threshold voltage adjust, such as with an ion implant of impurities 150 or other impurity introducing process, is performed to further adjust the threshold voltage in a channel region 155 where the split gate electrode is to be formed in the cell region. Prior to the second threshold voltage adjust ion implantation of impurities 150, first gate electrode 140 in cell region 105 may be optionally covered in some embodiments with a mask 160 (shown in dotted line) to protect electrode 140, but mask 160 is not required in cell region 105 in other specific embodiments. In the periphery region 110, a mask 160 (shown in solid line) is formed prior to the second threshold voltage adjust ion implantation step to protect electrode 145 from the implantation of impurities 150. Mask 160 in periphery region 110 masks the periphery logic circuitry to thereby avoid an improper adjustment of threshold voltage in that region. As shown in FIG. 2D, gate electrode 145 in periphery region 110 has a transistor channel region 130 formed thereunder from the first threshold voltage adjust implantation, in the specific embodiment. Of course, in other embodiments, the transistor channel region 130 formed under gate electrode 145 in periphery region 110 may be formed from a separate threshold voltage adjust implantation different from the first or the second threshold voltage adjust implantation steps mentioned above. According to a specific embodiment, for the PMOS type transistor channel region 155 formed in an N type substrate 100, impurities 150 are P type (e.g., B, $BF_2$, or the like) and are implanted at an energy level of about 20–50 keV and a dosage of about $10^{12}$ to $10^{14}$ carriers/$cm^2$ in order to adjust the threshold voltage under the split gate electrode to the desired level when combined with the first threshold voltage adjust ion implant 125 in channel region 155. According to another specific embodiment, for an NMOS type transistor channel region 130 formed in a P type substrate 100, impurities 150 are P type (e.g., B, $BF_2$, or the like) and are implanted at an energy level of about 20–50 keV and a dosage of about $10^{12}$ to $10^{14}$ carriers/$cm^2$ in order to adjust the threshold voltage under the split gate electrode to the desired level when combined with the first threshold voltage adjust ion implant 125 in channel region 155.

In accordance with the present invention, in the cell region 105, the threshold voltages under the first gate electrode and under the split gate electrode are separately controlled via different implants. For NMOS devices, the threshold voltage under the floating gate should be as low as possible. Depending on whether the first gate electrode or the split gate electrode is used as the floating gate, the threshold voltage under that gate can thus be controlled to be very low to provide increased cell current without the need for modification of the tunnel oxide or of the gate coupling ratio. For a split gate flash cell, the current conducting channel is under the select (or control or erase) gate or floating gate. Since the select gate can be used to shut the cell off, the threshold voltage under the floating gate can be made very small or even negative (for NMOS type cells) in order to have a higher cell current. Therefore, the threshold voltage adjust implant under the floating gate can be controlled with the present invention for improved cell erase performance.

Figure 2E:
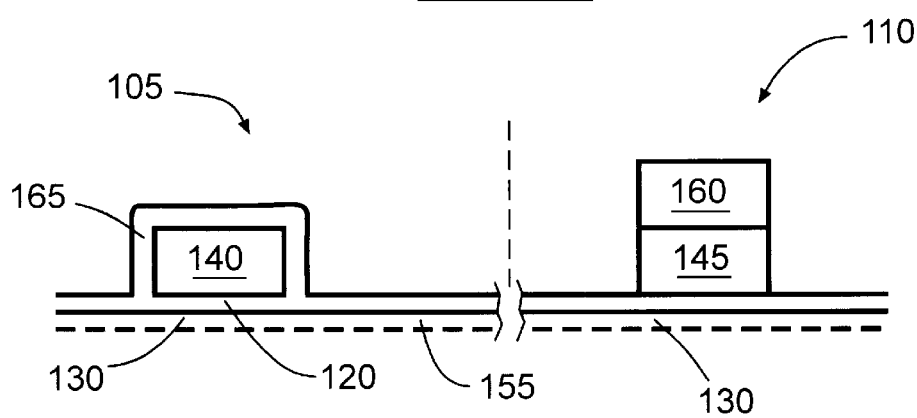

As shown in FIG. 2E, an oxidation process such as a thermal oxidation process, e.g., subjecting the silicon substrate 100 to an oxygen-containing environment in a thermal oxidation furnace, is performed to form a thick "interpoly" oxide 165 grown over first gate electrode 140.

Figure 2F:
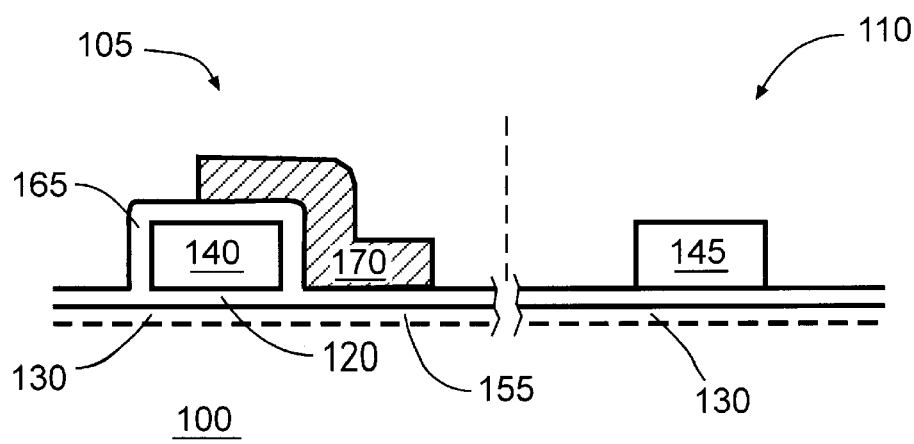

After this oxidation process, a second conducting layer is formed over a portion of gate electrode 140 covered by interpoly oxide 165 and over part of the gate oxide, and masked and patterned then etched to form the split gate electrode 170, as illustrated in FIG. 2F. After the split gate electrode 170 in cell region 105 and other electrodes (not shown) in periphery region 110 are formed from the second conducting layer, the mask 160 is removed and other remaining processing steps follow. The thickness of oxide 165 separating gate electrode 140 and a split gate electrode 170 may be about 300–500 Å, and the thickness of oxide 120 separating substrate 100 and gate electrodes 140 and 170 is about 100 Å, in some specific embodiments. To improve electrode conductivity, the second conducting layer also may be in situ doped or doped subsequent to deposition. Split gate electrode 170 may function as a floating gate electrode in the split gate cell, or as a select/control or erase gate electrode in the split gate cell, depending on the particular flash EEPROM device structure used.

Although not shown, source/drain regions and lightly-doped drain (LDD) regions for the transistors also are formed, e.g. by implanting or diffusion. According to a specific embodiment, for a PMOS type transistor formed in an N type substrate 100, P type source/drain regions having a concentration of about $10^{18}$ to about $10^{23}$ carriers/cm$^3$ may be formed. According to another specific embodiment, for an NMOS type transistor formed in a P type substrate 100, N type source/drain regions having a concentration of about $10^{18}$ to about $10^{23}$ carriers/cm$^3$ may be formed. The gate used as the floating gate electrode has a concentration of about $10^{18}$–$10^{23}$ carriers/cm$^3$ when about 3–12 volts are applied to the source for an erase. It is noted that before or after the threshold voltage ion implantation steps, isolation structures like isolation trenches or field oxide, etc. are also formed between cells.

With the present invention, split gate flash EEPROMs have improved cell erase performance, due to the ability to adjust the threshold voltage under the first gate electrode and to adjust the threshold voltage under the split gate electrode. In particular, in split gate flash EEPROMs, the threshold voltage for the transistor (e.g., NMOS) channel region under the gate electrode used as the select/control gate can be controlled, with the capability to adjust the threshold voltage under the floating gate. Therefore, the cell current can be as high as possible for an erase to speed up the erase time, without the need for decreasing the tunnel oxide thickness or for increasing the gate width or cell size.

Accordingly, the present invention provides reliable and improved cell performance for split gate cells in ROM devices, especially in split gate cell flash EEPROM devices, without the problems of the prior art approaches. To form a complete EEPROM device, additional steps besides those described above would be performed. Exemplary split gate cell flash EEPROM devices in which the method of the present invention may be used to provide improved cell performance are described in further detail below.

Figure 3:
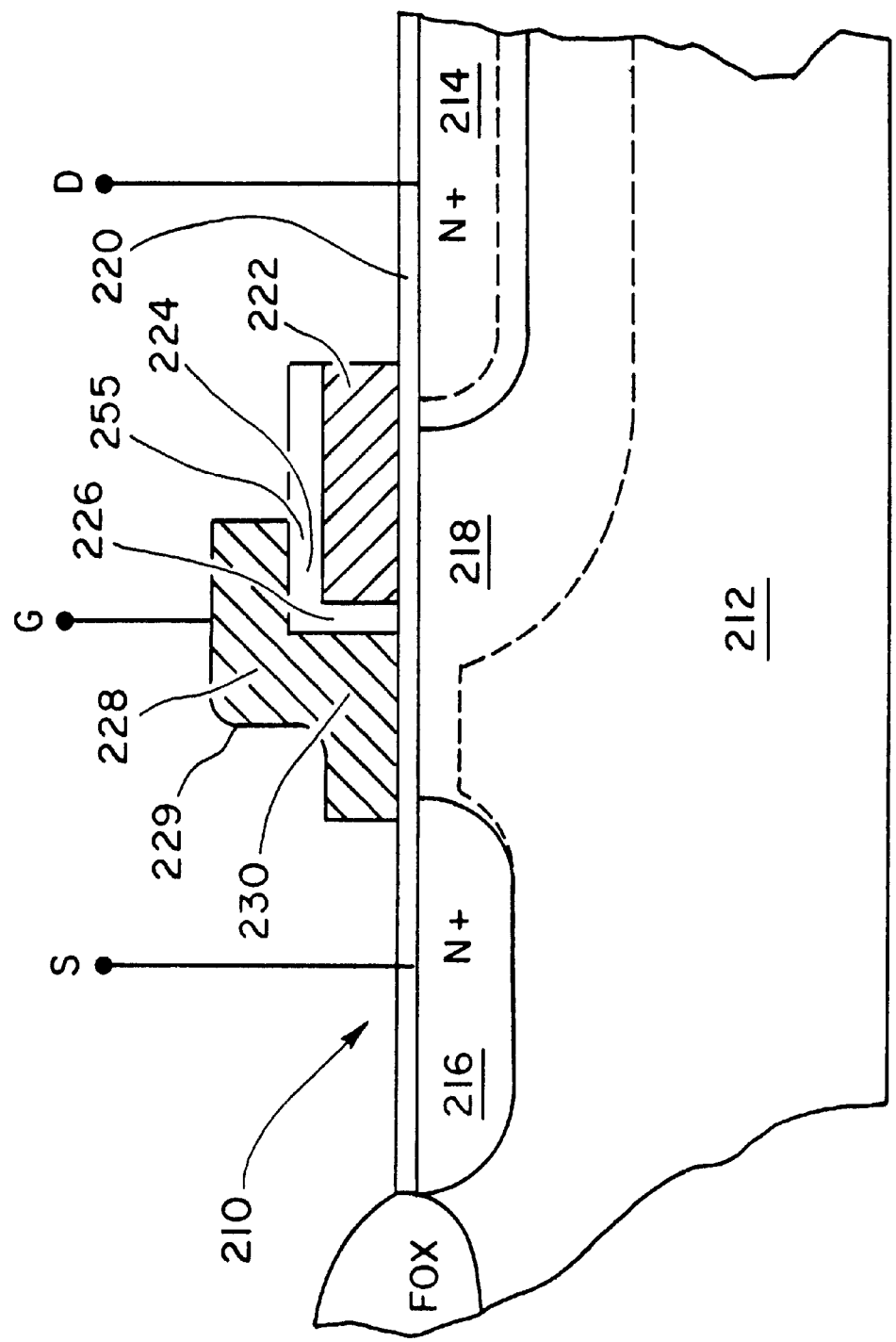
FIG. 3 illustrates a flash memory cell 210 in a partially completed EEPROM device formed in accordance with FIGS. 2A–2F, in accordance with a specific embodiment of the present invention.

FIG. 3 illustrates an example of a memory cell in a flash memory device according to a specific embodiment of the present invention. Referring to FIG. 3, there is shown a single transistor non-volatile electrically alterable semiconductor memory cell 210. The cell 210 comprises a semiconductor substrate 212, such as silicon. The substrate 212, in one embodiment, can be a P-type silicon substrate with a typical doping level range from 5 to 50 Ω-cm, depending on the level of scaling.

Within the substrate 212 are defined a source region 216 and a drain region 214 with a channel region 218 therebetween. Disposed over the source region 216, channel region 218, and drain region 214 is a first layer 220 of insulating material, on the order of, e.g., 70–200 Å angstrom of thickness.

Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate. A second insulating layer 225 has a first portion 224 disposed over the floating gate 222 and a second portion 226 disposed adjacent to the floating gate 222. The first portion 224 (top wall 224) of the second layer 225 is an insulating material and can be silicon dioxide, silicon nitride or silicon oxynitride and is on the order of, e.g., 1000–3000 Å in thickness. The second portion 226 (side wall 226) of the second layer 225 is also of an insulating material and can be silicon dioxide, silicon nitride or silicon oxynitride and is on the order of, e.g., 150–1200 ÅA in thickness. A control gate 229 has two portions: a first portion 228 that is disposed over the top wall 224 of the second layer 225; and a second portion 230 that is disposed over the first layer 220 and is immediately adjacent to the side wall 226 of the second layer 225. The second portion 230 of the control gate 229 extends over a portion of the source region 216 and over a portion of the channel region 218.

The dimensions of the cell 210 depend upon the process used. Thus, the foregoing dimensions for the first layer 220, side wall 226, and top wall 224 are only illustrative examples. Further, the materials, for the first layer 220 and the second layer 225 are also illustrative examples only. In general, however, the dimensions of the cell 210 are such that electrons emanating from the source region 216 are injected onto the floating gate 222 by sensing an abrupt potential drop. Further, the dimensions of cell 210 are such that charges from the floating gate 222 are removed by tunneling through the Fowler-Nordheim mechanism through the second layer 225 onto the control gate 229.

The particular manner of operating the cell 210 is as follows. Initially, when it is desired to erase cell 210, a ground potential is applied to the drain 214 and to the source 216. A high-positive voltage, on the order of, e.g., +15 volts, is applied to the control gate 229. Charges on the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level, in the vicinity of the threshold voltage of the MOS structure defined by the control gate 229 (on the order of approximately of +1 volt, for example), is applied to the control gate 229. A positive high voltage, on the order of, e.g., +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential drop approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on. When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating, gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the cell 210 is sensed to be programmed at the "0" state.

Figure 4:
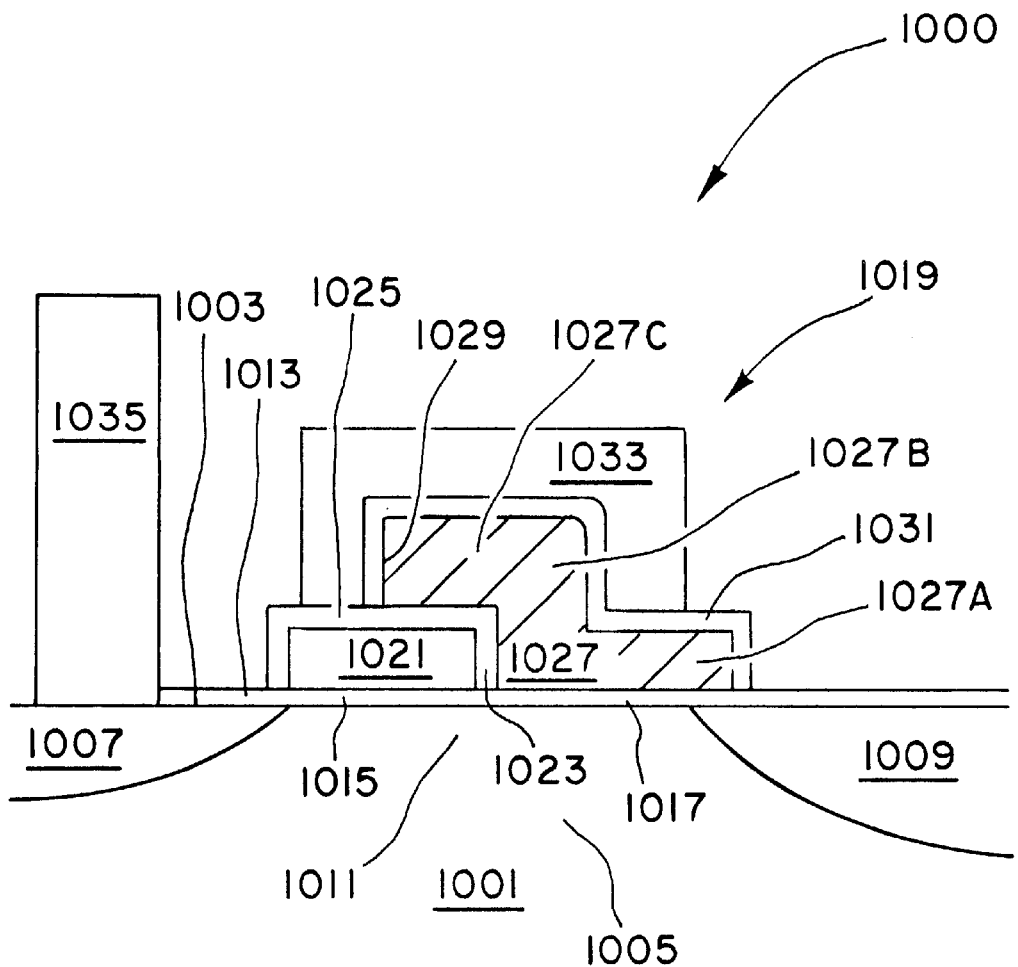
FIG. 4 illustrates an improved flash memory cell 1000 in a partially completed EEPROM device formed in accordance with FIGS. 2A–2F, in accordance with another specific embodiment of the present invention.

In another specific embodiment, the present invention can also be applied to an improved flash memory cell 1000, such as the one shown in the simplified diagram of the FIG. 4. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a $POCl_3$ compound or the like. Alternatively, the split gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, control gate, floating gate. The select gate also has a channel region ranging from about 0.3 μm and less, or about 0.7 μm and less, but is not limited to these ranges. Additionally, the select gate has a thickness of about 1000 Å and less, or about 3000 Å and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate. The split gate 1027 also has an edge 1029 overlying a region on the top surface of the select gate. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer deeding upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present structure, the GCR is increased by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values of about 0.2–0.8, or greater than 0.2, or greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

The present invention may be used to separately control the threshold voltage under the control gate 229 (for the embodiment of FIG. 4) and the threshold voltage under the floating gate 1027 to provide for improved cell erase performance without further increasing the gate coupling ratio.

In a specific embodiment, the present memory cell can be programmed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiments described above are merely examples of flash memory devices. Integrated circuits include one or more of these devices in a cell. Thousands, millions, billions, and even trillions of these devices are formed in a single integrated circuit chip. Thus, the integrated circuit chip can have up to 4 Meg., 16 Meg. 64 Meg. 256 Meg., 1 Gig. or more devices on a single sliver of silicon. The channel length of these devices range from about 0.4 $\mu$m to 0.25 $\mu$m and less. The flash memory device can be formed in a stand alone integrated circuit chip, commonly termed the flash memory chip, in some embodiments. Alternatively, the flash memory device can be integrated into a microprocessor, microcomputer, digital signal processor, application specific integrated circuit, and the like. Of course, the number of cells and design size depend highly upon the application.

While the above is a full description of the specific embodiments, various modifications, alternative constructions and equivalents may be used. For example, specific dimensions are discussed above for the specific embodiments. But of course, these dimensions may depend on the particular application. The gate electrode may also be a silicide gate, polycide gate, or the like, and combinations thereof. The suicide may be selected from refracting metal combinations such as $WSi_2$, $TaSi_2$, $TiSi_2$, $CoSi_2$, $MoSi_2$, among others. Although the specific embodiments discuss ion implantation for the threshold voltage adjust steps, other impurity introducing processes also may be used. Although the gate oxide is formed prior to the threshold voltage adjust implants, it may be possible in other embodiments to form the first threshold voltage adjust implant before forming the gate oxide. Therefore, the above description and illustrations should not be taken as limiting the scope of the present invention which is defined by the appended claims.

What is claimed is:

1. A method of forming a semiconductor device comprising:

providing a semiconductor substrate;

forming a thin oxide layer on said semiconductor substrate;

introducing first impurities into a first region of said semiconductor substrate where a first gate electrode is to be formed and into a second region of said semiconductor substrate where a second gate electrode and a split gate electrode are to be formed, said first introducing step adjusting a first threshold voltage in said first region;

forming said first gate electrode on said thin oxide layer in said first region;

forming said second gate electrode on said thin oxide layer in said second region, said second gate electrode having a top surface and a side surface;

introducing second impurities into said second region of said semiconductor substrate where said second gate electrode is formed and said split gate electrode is to be formed and not into said first region, said second introducing step adjusting a second threshold voltage in said second region by combining said first impurity with said second impurity;

forming a dielectric layer over said top surface and said side surface of said second gate electrode; and forming said split gate electrode on at least a portion of said dielectric layer formed over said second gate electrode and over said second region.

2. The method of claim 1 wherein said first gate electrode and said split gate electrode comprise polysilicon and wherein said semiconductor substrate comprises silicon.

3. The method of claim 2 wherein said first gate electrode has a thickness of about 100–2500 Å for said first gate electrode having a width of about 2.0 $\mu$m or less.

4. The method of claim 1 wherein said thin oxide layer has a thickness of about 70–250 Å.

5. The method of claim 1 wherein said dielectric layer has a thickness of about 300–500 Å separating said first gate electrode from said split gate electrode.

6. The method of claim 1 wherein said second gate electrode comprises a floating gate electrode.

7. The method of claim 1 wherein said split gate electrode comprises a floating gate electrode.

8. The method of claim 1 wherein said first and second introducing steps comprise ion implantation steps.

9. The method of claim 8 wherein said first introducing step comprises an ion implantation of about $10^{12}$ to $10^{14}$ carriers/cm$^2$ at an energy level of about 20–50 keV.

10. The method of claim 8 wherein said second introducing step comprises an ion implantation of about $10^{12}$ to $10^{14}$ carriers/cm$^2$ at an energy level of about 20–50 keV.

11. The method of claim 1 wherein said first and second impurities comprise P type impurities.

12. The method of claim 11 wherein said P type impurities are selected from a group consisting essentially of B and BF$_2$.

13. The method of claim 1 wherein said semiconductor device comprises a split gate cell EEPROM semiconductor device.

14. The method of claim 13 wherein said EEPROM semiconductor device comprises a flash EEPROM semiconductor device.

15. The method of claim 2 wherein said first gate electrode has a thickness of less than about 100 Å for said first gate electrode having a width of less than about 2.0 μm.

16. The method of claim 15 wherein said thin oxide layer has a thickness of less than about 100 Å.

17. The method of claim 15 wherein said dielectric layer has a thickness of less than about 300 Å separating said first gate electrode from said split gate electrode.

18. A method of forming a flash EEPROM device having improved cell erase performance, said method comprising:

providing a semiconductor substrate;

forming a thin oxide layer on said semiconductor substrate;

introducing first impurities into a first region of said semiconductor substrate where a first gate electrode is to be formed and into a second region of said semiconductor substrate where a second gate electrode and a split gate electrode are to be formed, said first introducing step adjusting a first threshold voltage in said first region;

forming said first gate electrode on said thin oxide layer in said first region;

forming said second gate electrode on said thin oxide layer in said second region, said second gate electrode having a top surface and a side surface;

introducing second impurities into said second region of said semiconductor substrate where said split gate electrode is to be formed and not into said first region, said second introducing step adjusting a second threshold voltage in said second region by combining said first impurity with said second impurity;

forming a dielectric layer over said top surface and said side surface of said second gate electrode; and forming said split gate electrode on at least a portion of said dielectric layer formed over said second gate electrode and over said second region; and wherein said adjusting of said first and second threshold voltages increases cell erase performance with or without increasing a cell size of said device or with or without decreasing a thickness of said thin oxide layer.

19. A method of forming a semiconductor device comprising the steps, in order, of:

providing a semiconductor substrate;

forming a thin oxide layer on said semiconductor substrate;

introducing first impurities into a fist region of said semiconductor substrate where a first gate electrode is to be formed and into a second region of said semiconductor substrate where a second gate electrode and a split gate electrode are to be formed, said first introducing step adjusting a first threshold voltage in said first region;

forming said first gate electrode on said thin oxide layer in said first region;

forming said second gate electrode on said thin oxide layer in said second region, said second gate electrode having a top surface and a side surface;

introducing second impurities into said second region of said semiconductor substrate where said split gate electrode is to be formed and not into said first region, said second introducing step adjusting a second threshold voltage in said second region by combining said first impurity with said second impurity;

forming a dielectric layer over said top surface and said side surface of said second gate electrode; and forming said split gate electrode on at least a portion of said dielectric layer formed over said second gate electrode and over said second region.

* * * * *